(12) United States Patent
Roy

(10) Patent No.: US 6,722,930 B2
(45) Date of Patent: Apr. 20, 2004

(54) I-CHANNEL SURFACE-MOUNT CONNECTOR

(75) Inventor: Apurba Roy, Carlsbad, CA (US)

(73) Assignee: di/dt, Inc., Carlsbad, CA (US)

( * ) Notice: Subject to any disclaimer, the term of this patent is extended or adjusted under 35 U.S.C. 154(b) by 0 days.

(21) Appl. No.: 10/138,173

(22) Filed: May 2, 2002

(65) Prior Publication Data

US 2002/0131255 A1 Sep. 19, 2002

Related U.S. Application Data

(62) Division of application No. 09/737,303, filed on Dec. 15, 2000.

(51) Int. Cl.[7] .............................................. H01R 40/50
(52) U.S. Cl. ...................... 439/874; 361/803; 361/804; 361/770; 439/83
(58) Field of Search .......................... 439/874, 65, 66, 439/591, 83; 257/692, 781; 361/785, 803, 804, 770; 174/52.1, 261, 266

(56) References Cited

U.S. PATENT DOCUMENTS

| | | | |
|---|---|---|---|
| 4,893,172 A | | 1/1990 | Matsumoto et al. .......... 357/79 |
| 5,067,007 A | | 11/1991 | Otsuka et al. ................ 357/74 |
| 5,151,773 A | * | 9/1992 | Matsui et al. ............ 174/50.52 |
| 5,324,892 A | * | 6/1994 | Granier et al. ................ 439/83 |
| 5,422,516 A | * | 6/1995 | Hosokawa et al. .......... 257/775 |
| 5,484,964 A | | 1/1996 | Dawson et al. ............. 174/261 |
| 5,518,964 A | | 5/1996 | DiStefano et al. .......... 437/209 |
| 5,538,447 A | | 7/1996 | Chadbourne et al. ....... 439/783 |
| 5,588,848 A | * | 12/1996 | Law et al. ..................... 439/83 |
| 5,640,052 A | * | 6/1997 | Tsukamoto ................. 257/781 |
| 5,730,608 A | * | 3/1998 | Legrady ....................... 439/78 |
| 5,927,036 A | | 7/1999 | Matthews et al. ......... 52/483.1 |
| 5,969,952 A | * | 10/1999 | Hayashi et al. ............... 439/83 |
| 5,984,692 A | * | 11/1999 | Kumagai et al. ............. 439/66 |
| 6,189,203 B1 | | 2/2001 | Heinrich et al. .............. 29/606 |
| 6,274,823 B1 | | 8/2001 | Khandros et al. ........... 174/261 |
| 6,429,388 B1 | | 8/2002 | Interrante et al. .......... 174/261 |

\* cited by examiner

Primary Examiner—Gary Paumen
Assistant Examiner—Briggitte R. Hammond
(74) Attorney, Agent, or Firm—Lowenstein Sandler PC

(57) ABSTRACT

In accordance with the invention, a low impedance surface-mount connector comprises a length of cylindrical rod having an I-shaped cross section. The device permits interconnection by pick-and-place techniques, and the interconnection has advantageous qualities of low resistance, low inductance, mechanical compliance and ease of manufacture. A first circuit device having one or more circuit components is interconnected with a second circuit device by surface mounting such connectors on the first circuit device, providing corresponding solder pads on the second circuit device, and mounting the connectors of the first circuit device onto the pads of the second.

13 Claims, 6 Drawing Sheets

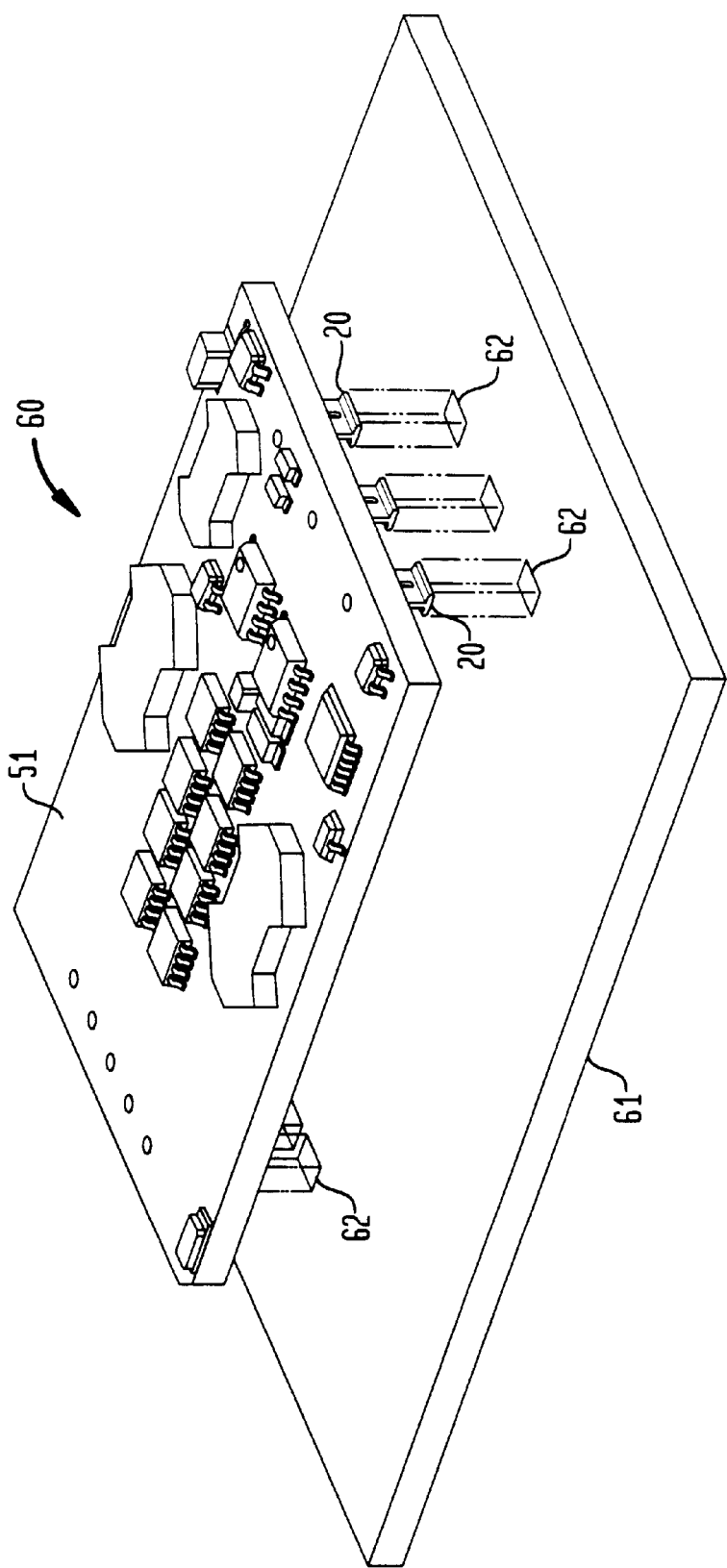

I-CHANNEL SURFACE-MOUNT CONNECTOR

CROSS REFERENCE TO RELATED APPLICATION

This is a divisional of U.S. patent application Ser. No. 09/737,303 filed by Apurba Roy on Dec. 15, 2000 and entitled "I-Channel Surface-Mount Connector". Application Ser. No. 09/737,303 is incorporated herein by reference.

FIELD OF THE INVENTION

This invention relates to devices for interconnecting circuit devices such as IC packages to circuit boards, circuit boards and modules to circuit boards or substrates, and substrates to substrates. Specifically, the invention relates to low impedance surface-mount connectors having advantageous qualities of compactness, low interconnection resistance, low inductance and mechanical compliance. The connectors can be surface mounted by pick-and-place techniques.

BACKGROUND OF THE INVENTION

As electronic circuits become denser, faster and increasingly complex, devices for interconnecting them are subject to more demanding requirements. With the great increase in the density of active components, interconnection devices become large consumers of available volume. And increased density brings an increase in required currents and power dissipation, aggravating thermal mismatch between connected circuit devices. In addition, higher circuit device speeds place stricter constraints on tolerable interconnect inductance. Accordingly, there is a need for improved devices for interconnecting circuits.

SUMMARY OF THE INVENTION

In accordance with the invention, a low impedance surface-mount connector comprises a length of cylindrical rod having an I-shaped cross section. The device permits interconnection by pick-and-place techniques, and the interconnection has advantageous qualities of low resistance, low inductance, mechanical compliance and ease of manufacture. A first circuit device having one or more circuit components is interconnected with a second circuit device by surface mounting such connectors on the first circuit device, providing corresponding solder pads on the second circuit device, and mounting the connectors of the first circuit device onto the pads of the second.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIG. 6 shows the first circuit device being mounted on a second larger circuit device;

It is to be understood that these drawings are for illustrating the concepts of the invention and are not to scale.

DETAILED DESCRIPTION

Figure 1:
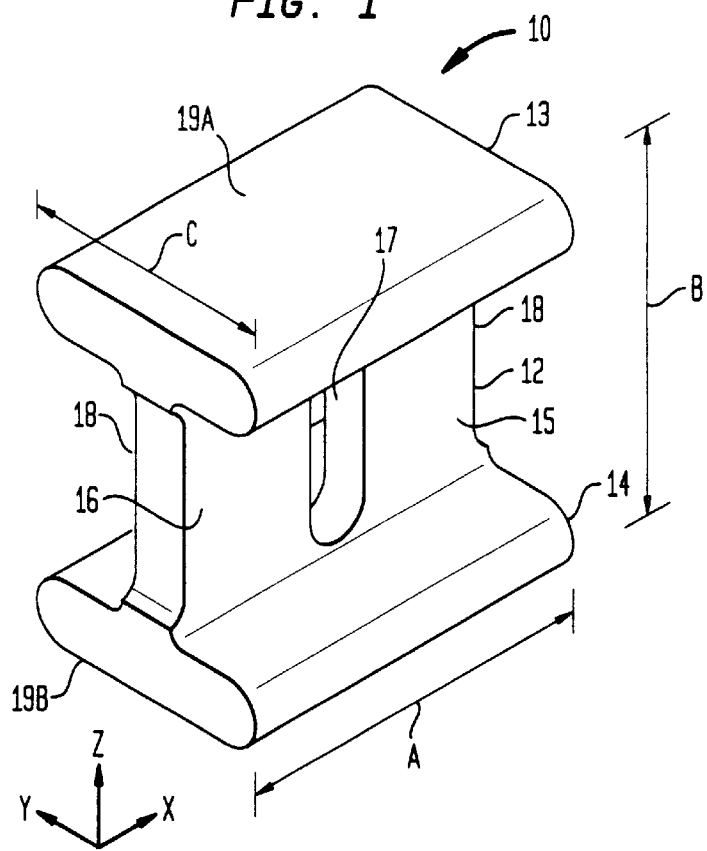
FIG. 1 is a perspective view of an I-channel surface mount connector in accordance with the invention.

Referring to the drawings, FIG. 1 is a perspective view of a novel surface mount connector 10 comprising an elongated metallic body of "I-shaped" cross section. The connector comprises a longitudinally extending central beam section 12 having laterally extending base sections 13, 14 at both edges. The longitudinal dimension of the connector can be divided into longitudinal sections 15, 16 by one or more slots 17. The ends of the body can include recessed regions 18, which can be formed as partial slots.

With reference to the coordinate system shown in FIG. 1, the connector 10 extends longitudinally along the x-axis. The major surfaces of the beam section 12 are parallel to the x-z plane, and the major surfaces of the base sections 13, 14 are parallel to the x-y plane. In the embodiments shown herein, the connector mounting surfaces are the outer major surface 19A of base 13 and the outer major surface 19B of base 14. The connector thus provides electrical and thermal connectivity in the z-direction.

In general, the connector length A is determined by the level of acceptable impedance for the connector. The greater the length, the lower the inductance and resistance. The height B is chosen to be greater than the height of the tallest component on the interconnect side of the circuit devices to be interconnected so that contact between the two circuit devices is only through the connectors. The base width C is chosen by tipping requirements for the connector, i.e. the maximum angle that the base outer surface can make with a planar substrate without falling over. Preferably the height B is greater than base width C, and the width C is sufficient to provide a tipping angle of at least 30°. The cross sectional corners of the base sections are advantageously rounded, as by a 7 mil radius, in order to provide a good fillet when soldered and thus produce reliable solder joints.

The presence and number of slots 17 is determined by the xy compliance requirements for the connector. A slot 17 will divide the beam section into two adjacent longitudinal sections 15, 16. Slots 17 should be dimensioned and placed so that the longitudinal dimension of each section 15, 16 does not exceed its height dimension. Thus if the length of a connector is less than its height, no slot is needed. If the length is greater than the height but not greater than twice the height, one slot is desirable. Recessed end regions 18 can reduce the effective length of the connector, reducing the need for slots to provide xy compliance. The optimal shape for a slot is geometrically similar to that of the central beam section 12, but rotated by 90°. A slot 17 can be confined to the beam section 12 as shown in FIG. 1 or, as shown below, can cut through one of the base sections.

These connectors can be easily fabricated by extruding a metal rod of (shaped cross section, punching the desired slots and cutting to desired length. The connectors can achieve very low impedance (electrical and thermal) because the rods can be extruded of soft metals of high electrical and thermal conductivity such as copper or silver.

Preferably the formed connector is plated with a solderable coating of Ni/Au or Ni/solder (e.g. tin-lead solder). The Ni advantageously has a thickness at least 50 microinch, the Au at least 3 microinch or the solder, at least 200 microinch.

Alternatively, the connectors can be fabricated as hollow cylinders of bent sheet material. The sheet material (e.g. 7 mil. sheet material) is punched to shape, folded into an I-shaped cross section and the desired slots are punched. In this instance copper-based alloys such as Be—Cu or phosphor bronze are favored over soft copper or silver to provide rigidity at the cost of increased impedance.

Typical lengths A are in the range 0.030"–0.300". Typical heights B are in the range 0.040"–0.120", and typical base widths C are in the range 0.025"–0.100". The central beam section 12 typically has a thickness in the range 0.010"–0.030", and the base sections 13, 14 typically have a thickness in the range 0.010"–0.030".

Figure 2:
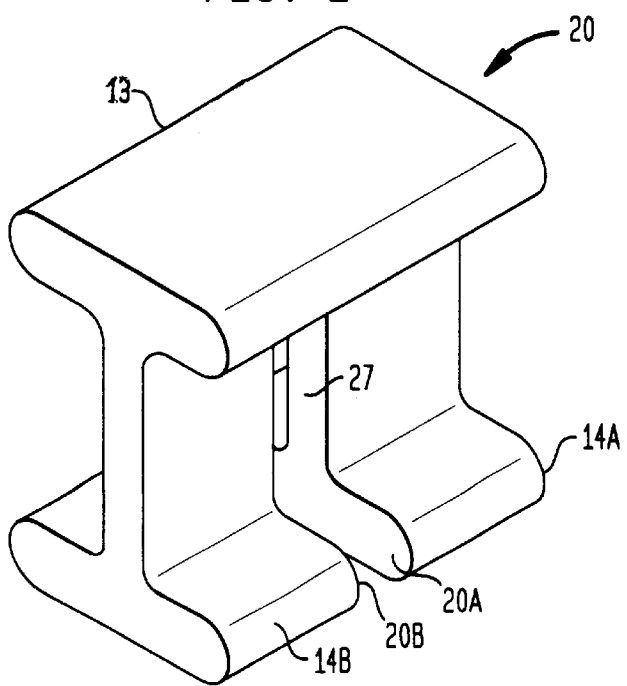
FIG. 2 illustrates an alternative embodiment comprising a connector similar to FIG. 1 except the slot extends through one of the bases.

FIG. 2 is a perspective view of an alternative embodiment of a connector 20 similar to FIG. 1 except that the slot 27 extends through one of the bases e.g. 14 and no recessed regions are provided at the longitudinal ends. The advantages of the extension of slot 27 through the base is that it divides the base into two portions 14A and 14B providing greater xy compliance. The division reduces the need for recessed ends and produces additional surfaces 20A and 20B against which solder bonding fillets can be formed. In addition the cut-through base provides self-alignment on an appropriately designed bonding pad. In preferred use, the cut-through base 14 is the base secured first to a circuit device.

Figure 3:
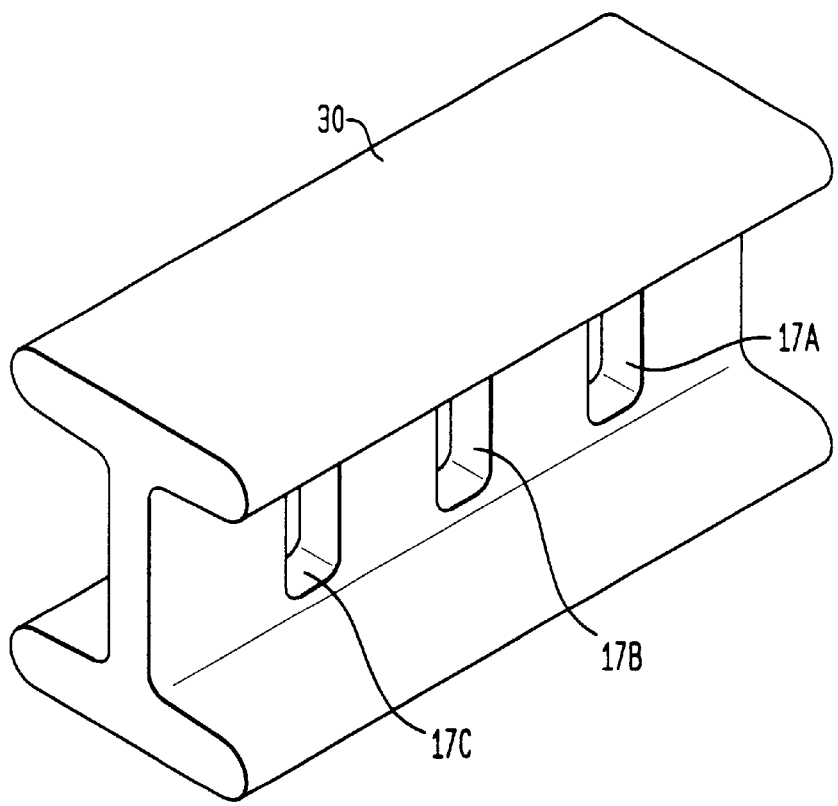
FIG. 3 illustrates an alternative embodiment employing a plurality of slots.

FIG. 3 is a perspective view of a third embodiment of a connector 30 similar to FIG. 1 except that the connector employs a plurality of slots 17A, 17B and 17C. The advantage of plural slots is that the connector, while still preserving xy-compliance, can have a greater length, providing reduced resistive, inductive, and thermal impedance. Advantageously the number of slots is sufficient to maintain the longitudinal extent of adjacent areas less than their height.

Figure 4:
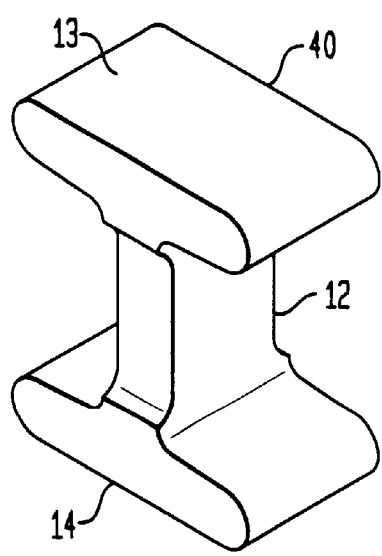
FIG. 4 is a perspective view of an embodiment employing no slots.

FIG. 4 is a perspective view of another embodiment of a connector 40 similar to FIG. 1 except that it is free of slots. This connector advantageously has a longitudinal dimension less than its height.

Figure 5:
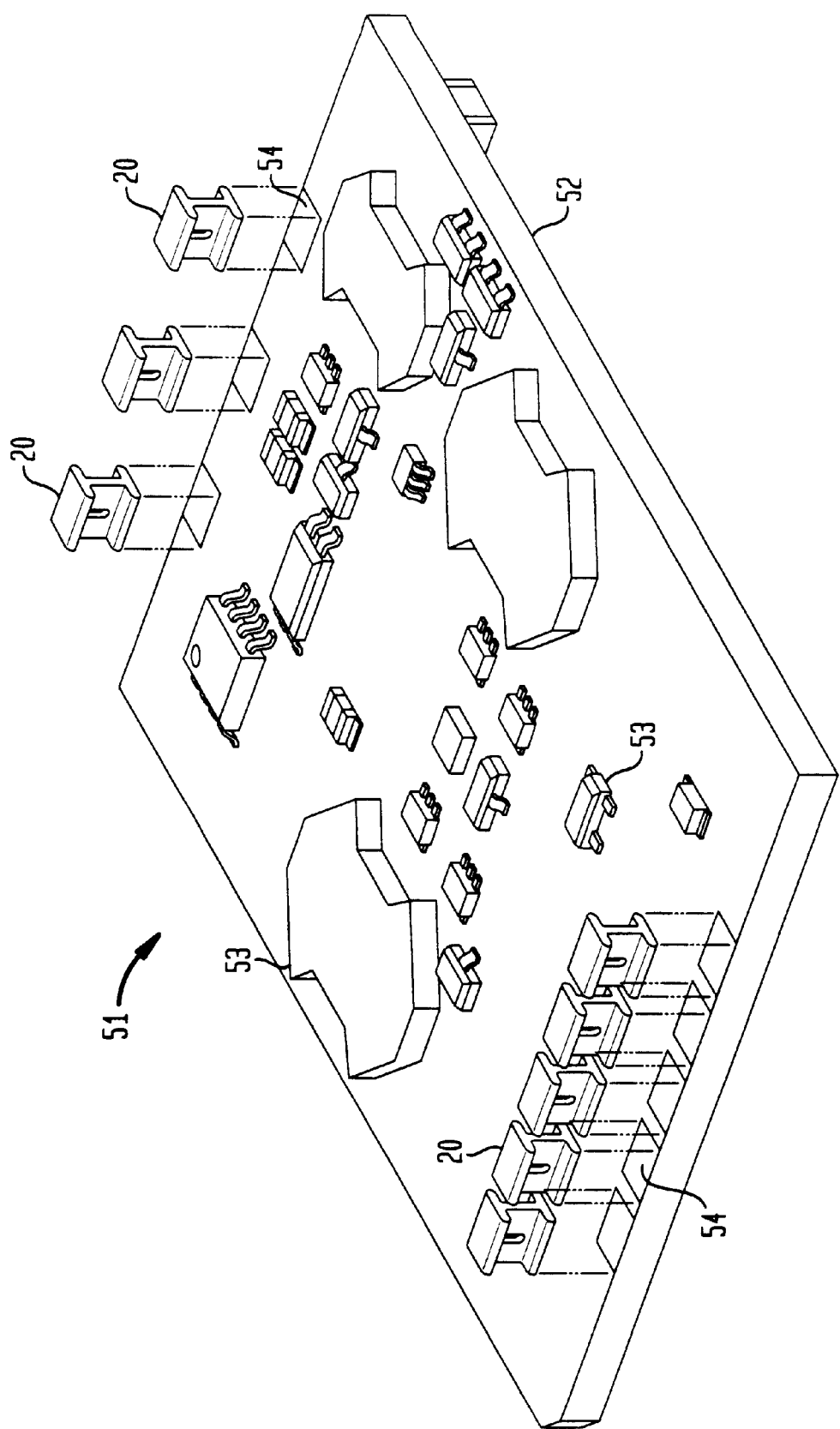
FIG. 5 is a perspective view showing surface mount connectors being mounted on a first circuit device.

FIG. 5 is a perspective view showing surface mount connectors 20 being mounted on a first circuit device 51. The circuit device 51 comprises a substrate or circuit board 52, one or more circuit components 53 and one or more mounting pads 54 for receiving connectors 20. Advantageously pads 54 are pre-coated with solder. Preferably the height of connectors 20 is greater than the height of any circuit component 53. The connectors can then be placed on the pads by standard pick-and-place techniques and can be soldered to the pads in a conventional solder reflow step.

The next step shown in FIG. 6 is to mount the first circuit device 51 onto a second circuit device 60. Device 60 can also comprise a package or substrate or circuit board 61 and is preferably the larger area circuit device of the two. As a preliminary step, circuit device 60 is provided with solder pads 62 appropriate in size and distribution for receiving the connectors mounted on circuit device 51. The pads 62 are preferably pre-coated with solder, and circuit device 51 can be applied on device 60 using pick-and-place techniques with connectors 20 in registration with pads 62. The two circuit devices can then be interconnected by solder reflow. The result is an interconnected composite device having advantageous qualities of, compactness, low interconnection resistance, low inductance and mechanical compliance.

The nature and advantages of the invention will become clearer by consideration of the following specific examples.

EXAMPLES

The principles of the invention were used to design and fabricate devices of the type shown in FIG. 1 to meet the needs of a specific application. The application required a total of 8 surface-mount interconnects between a "circuit device" comprising a circuit board and a "motherboard" (a circuit board of larger area). The height of the tallest component on the interconnected side of the circuit device was H=0.070". The impedance requirements, dictated by device performance needs, were that each interconnect have a maximum inductance of 0.30 nH, and a maximum resistance of 50 micro-ohm. The mechanical requirement was compliance in both X and Y directions, in the face of thermal stress caused by large differentials between the operating temperature of the circuit device and the motherboard. In addition, the area occupied by each interconnect needed to be very small, while still maintaining a minimum angle of tip of at least 30° for stability prior to reflow.

The device height B was chosen to be B=0.082", to meet the B>H requirement. The base width C was selected as C=0.068", with a 0.007" radius at the cross sectional corners to facilitate adequate solder fillets. This combination of B, C and the radius yielded an angle of tip of 38°. To provide necessary compliance in the Y direction and mechanical stability, the thickness of the central beam section was selected to be 0.015", and that of the basesection was selected to be 0.014".

Once the above dimensions were fixed, the connector length A and width of the slot were determined on the basis of meeting the requirements for impedance and X-directional compliance. A length of A=0.100" and a slot width of 0.015", with recessed end regions of width 0.0075", were found adequate, in conjunction with the selection of copper, USN nomenclature C11000, as the device material. The inductance was calculated to be 0.27 nH, and the resistance was 37 micro-ohm. The device footprint was 0.100"×0.068", with a pad size of 0.116"×0.084". Thus, all requirements of the application were satisfied.

Connectors meeting the above dimensions were fabricated starting with C11000 copper rod of the required I-shaped cross section. They were plated with 50 micro-inch Ni, followed by 3 micro-inch Au in one case and 200 micro-inch solder in another case.

Figure 7A:
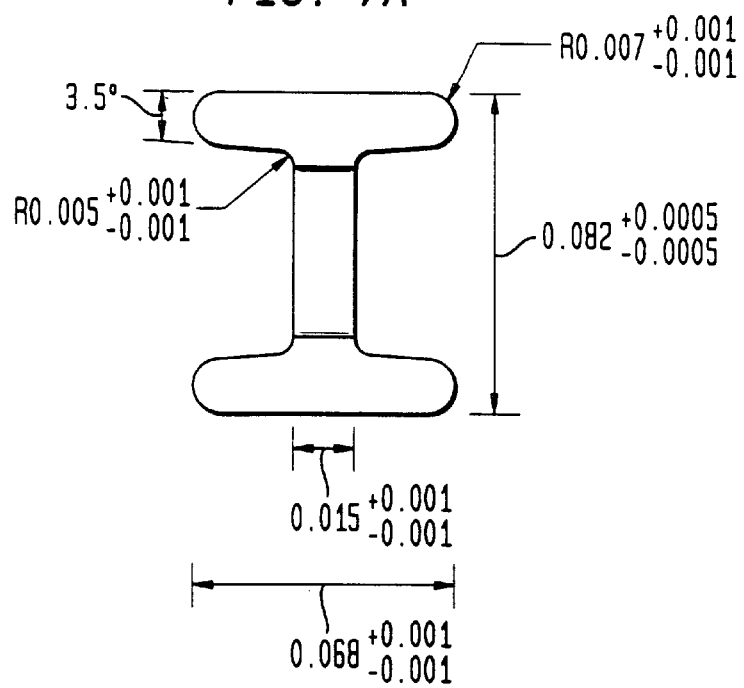
FIGS. 7A and 7B are cross sectional and side views showing dimensions of 20 a specific connector of the type shown in FIG. 1.
Figure 7B:
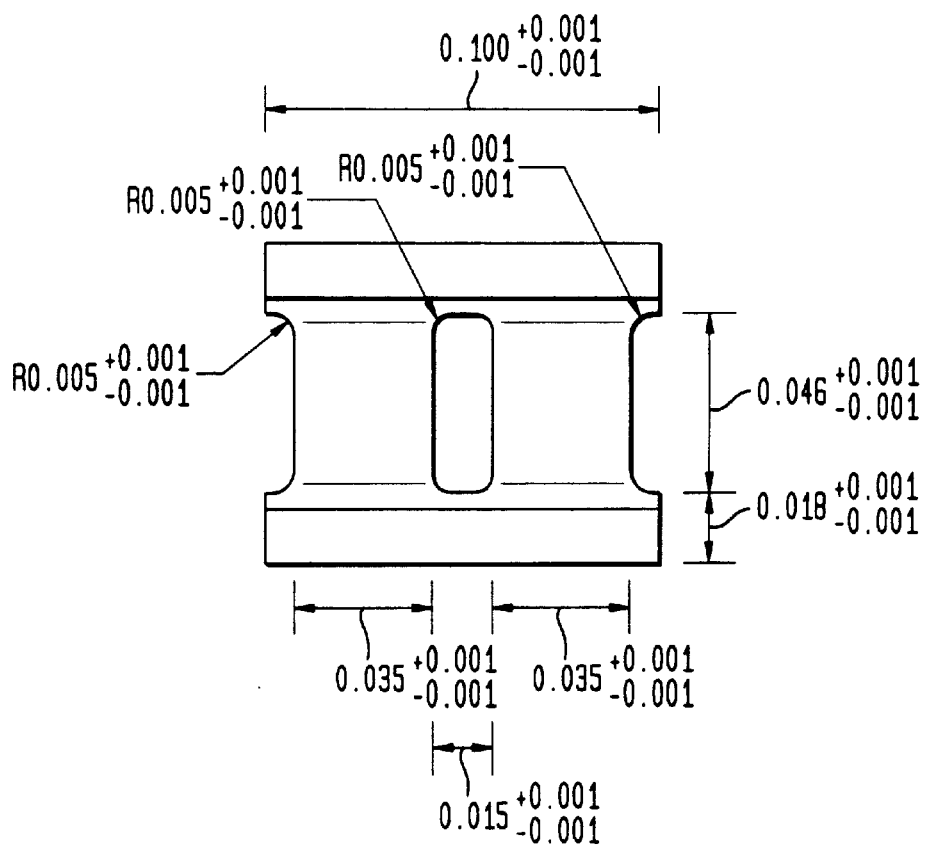

FIGS. 7A and 7B are cross sectional and side views showing the dimensions of the devices as fabricated. All dimensions are in inches.

Figure 8A:
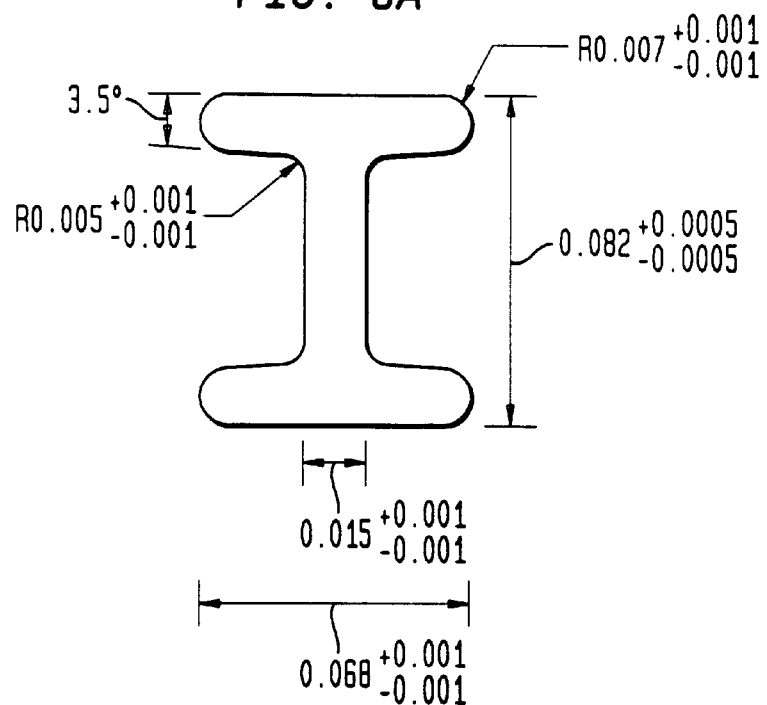
FIGS. 8A and 8B are cross sectional and side views showing dimensions of a specific connector of the type shown in FIG. 2.
Figure 8B:
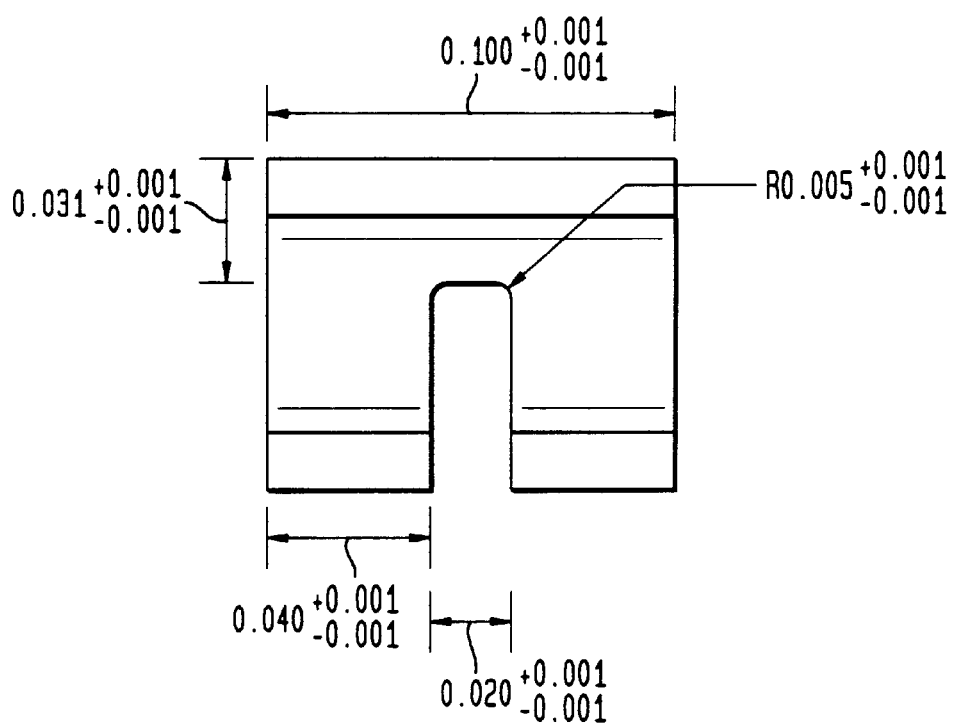

FIGS. 8A and 8B are cross sectional and side views showing the dimensions of a specific device of the type shown in FIG. 2. All dimensions are in inches.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A surface mount connector for electrically connecting two circuit devices, the surface mount connector comprising:

a longitudinally extending substantially cylindrical metallic body having an I-shaped transverse cross section, the body comprising a longitudinally extending central beam section having at each longitudinally extending edge a laterally extending base section, the central beam section comprising a pair of major surfaces, and each base section having a mounting surface perpendicular to the central beam section for bonding to a circuit device;

wherein the body further comprises one or more slots extending transversely through one of the base sections.

2. The surface mount connector of claim 1 wherein the height of the body measured between the mounting surfaces exceeds the length of the body.

3. The surface mount connector of claim 1 wherein the height of the body measured between the mounting surfaces exceeds the width of the base section.

4. The surface mount connector of claim 1 wherein the body comprises copper or silver and further comprises one or more regions plated for solderability.

5. The surface mount connector of claim 1 wherein the body comprises extruded copper or silver.

6. The surface mount connector of claim 1 wherein the body comprises a hollow cylinder of bent copper alloy sheet material.

7. The surface mount connector of claim 1 wherein the base sections have laterally extending ends with rounded edges to facilitate secure solder bonding.

8. The surface mount connector of claim 1 wherein the central beam section includes recessed regions.

9. An interconnected device comprising two circuit devices interconnected by the connector of claim 1.

10. The surface mount connector of claim 1 wherein the one or more slots extend transversely through the central beam section.

11. An interconnected device comprising two circuit devices interconnected by the connector of claim 10.

12. The surface mount connector of claim 1 wherein the one or more slots divide the major surfaces of the central beam section into a plurality of regions, each region having a height greater than its length.

13. An interconnected device comprising two circuit devices interconnected by the connector of claim 12.

* * * * *